(12) United States Patent
Choi et al.

(10) Patent No.: US 6,781,309 B2
(45) Date of Patent: Aug. 24, 2004

(54) PLASMA SWITCHED ORGANIC ELECTROLUMINESCENT DISPLAY

(75) Inventors: Do-hyun Choi, Seoul (KR); Byung-hyun Byun, Daejeon (KR); Seung-jun Yi, Seoul (KR)

(73) Assignee: CLD, Inc., Seoul (KR)

( * ) Notice: Subject to any disclaimer, the term of this patent is extended or adjusted under 35 U.S.C. 154(b) by 221 days.

(21) Appl. No.: 09/995,642

(22) Filed: Nov. 29, 2001

(65) Prior Publication Data

US 2002/0063525 A1 May 30, 2002

(30) Foreign Application Priority Data

Nov. 29, 2000 (KR) ......................................... 2000-71445
Nov. 9, 2001 (KR) ......................................... 2001-69888

(51) Int. Cl.⁷ ............................................... H01J 17/49
(52) U.S. Cl. ........................ 313/586; 313/498; 313/582; 313/499
(58) Field of Search ................................. 313/582, 583, 313/584, 585, 586, 587, 498, 499, 504, 506; 315/169.3, 169.4

(56) References Cited

U.S. PATENT DOCUMENTS

| | | |
|---|---|---|
| 4,769,292 A | 9/1988 | Tang et al. |
| 5,294,870 A | 3/1994 | Tang et al. |
| 5,399,502 A | 3/1995 | Friend et al. |
| 5,420,602 A | 5/1995 | Kanazawa |
| 5,661,500 A | 8/1997 | Shinoda et al. |
| 5,674,553 A | 10/1997 | Shinoda et al. |
| 5,807,627 A | 9/1998 | Friend et al. |
| 6,090,149 A | 7/2000 | Nair et al. |
| 6,297,590 B1 * | 10/2001 | Nanto et al. ................. 313/586 |
| 6,531,820 B1 * | 3/2003 | Lee et al. ..................... 313/586 |

FOREIGN PATENT DOCUMENTS

JP          07147189     *  6/1995   ........... H05B/33/04

* cited by examiner

*Primary Examiner*—Edward J. Glick
*Assistant Examiner*—Elizabeth Gemmell
(74) *Attorney, Agent, or Firm*—Birch, Stewart, Kolasch & Birch, LLP

(57) ABSTRACT

Described is a plasma switched organic electroluminescent display, which includes an electroluminescent part including a cathode layer, an electroluminescent layer on the cathode layer, and an anode layer on the electroluminescent layer, a first power supply unit connected electrically to the anode layer and disconnected electrically to the cathode layer so as to supply the electroluminescent layer with a first power, a plasma generating part generating a plasma wherein the plasma becomes contacted with the cathode layer, and a second power supply unit generating the plasma by supplying the plasma generating part with a second power, wherein the cathode layer is connected electrically to the first power supply unit through the plasma, thereby enabling to emit light by organic electroluminescent as well as drive the display by a low driving voltage using a plasma discharge as a switch.

23 Claims, 13 Drawing Sheets

Light Out

Light Out

Light Out

PLASMA SWITCHED ORGANIC ELECTROLUMINESCENT DISPLAY

BACKGROUND OF THE INVENTION

1. Field of the Invention

The present invention relates to an organic electroluminescent display, and more particularly, to a plasma switched organic electroluminescent display driven by plasma switches.

2. Background of the Related Art

As information telecommunication technologies have been greatly developed, a variety of demands for electronic display devices are highly increased to keep up with the developing information society. And, so do the demands for various displays. In order to satisfy the demands of the information society, for electronic display devices are required characteristics such as high-resolution, large-size, low-cost, high-performance, slim-dimension, and small-size and the like, for which new flat panel displays(FPD) are developed as substitutions for the conventional cathode ray tube(CRT).

The FPDs include LCD(liquid crystal display), ELD (electroluminescent display), PDP(plasma display panel), FED(field emission display), VFD(vacuum fluorescence display), and LED(light emitting display), and the like.

Compared to the non-emissive device such as LCD, ELD attracts attention as FPD having a response speed faster than that of the non-emissive display, excellent brightness by self-luminescence, easy fabrication thanks to a simple structure, and light weight/slim design. Thus, ELD is widely applied to various fields such as LCD backlight, mobile terminal, car navigation system(CNS), notebook computer, wall TV, and the like.

Such an ELD is divided into two categories, i.e. organic electroluminescent display (hereinafter abbreviated OELD) and inorganic electroluminescent display (hereinafter abbreviated IELD) in accordance with materials used for luminescent layers respectively.

IELD, which emits light using the collisions of electrons accelerated by an high electric field, is classified into AC thin film ELD, AC thick film ELD, DC thin film ELD, and the like in accordance with thickness of the thin films and driving systems.

And, OELD, which emits light by a current flow, is classified into low-molecular OELD and high-molecular OELD.

FIG. 1 illustrates a cross-sectional view of a basic construction of OELD using a high molecular electroluminescent material according to a related art.

Referring to FIG. 1, stacked on a transparent substrate 11 such as a glass substrate in order are a transparent anode layer 12 formed of ITO(indium tin oxide) or IZO(indium zinc oxide), a hole transport layer 13, an electroluminescent layer 14, and a cathode layer 15 formed of a metal.

A material for the electroluminescent layer 14 is a conductive high molecule as a kind of conjugated polymers disclosed on U.S. Pat. No. 5,399,502, and U.S. Pat. No. 5,807,627 such as poly(p-phenylenevinylene), i.e. PPV, poly (thiophene), poly(2,5-dialkoxyphenylene-vinylene, i.e. PDMeOPV or the like.

FIG. 2 illustrates a cross-sectional view of a basic construction of OELD using a low molecular electroluminescent material for fluorescence according to a related art.

Referring to FIG. 2, stacked on a transparent substrate 21 such as a glass substrate in order are a transparent anode layer 22 formed of ITO(indium tin oxide) or IZO(indium zinc oxide), a hole injection layer 23, a hole transport layer 24, an electroluminescent layer 25, an electron transport layer 26, and a cathode layer 27 formed of metal. The hole injection layer 23, hole transport layer 24, and electron transport layer 26 play an auxiliary role in increasing a luminescent efficiency of OELD. In this case, the electroluminescent layer 25 is formed of aluminum tris(8-hydroxyquinoline), i.e. Alq3, perylene, or the like, which are disclosed on U.S. Pat. No. 4,769,292 and U.S. Pat. No. 5,294,870.

FIG. 3 illustrates a cross-sectional view of a basic construction of OELD using a low molecular electroluminescent material for phosphorescence according to a related art.

Referring to FIG. 3, stacked on a transparent substrate 31 such as a glass substrate in order are a transparent anode layer 32 formed of ITO(indium tin oxide) or IZO(indium zinc oxide), a hole injection layer 33, a hole transport layer 34, an electroluminescent layer 35, a hole blocking layer 36, an electron transport layer 37, and a cathode layer 38 formed of metal.

The hole injection layer 33, hole transport layer 34, hole blocking layer 36, and electron transport layer 37 play an auxiliary role in increasing a luminescent efficiency of OELD. In this case, the electroluminescent layer 35 is formed of one of phosphorescent emitting materials disclosed on U.S. Pat. No. 6,090,149 such as platinum 2,3,7, 8,12,12,17,18-octaethyl-21H,23H-porphine, i.e. PtOEP, iridium complex of Ir(PPY)3, and the like. And, the hole blocking layer 36 is formed of bathocuproine, i.e. BCP, cabazole biphenyl, i.e. CBP, N,N'-diphenyl-N,N'-bis-alphanapthylbenzidine, i.e. NPD.

OELD is divided into active and passive types in accordance with the driving systems. The passive type OELD is driven by a current driving system so that an efficiency of power consumption and a device reliability are decreased as a panel size increases. To settle such problems in case that a diagonal diameter of a panel is longer than 10 inches, the active type OELD using polysilicon thin film transistors (poly-Si TFT) as driving devices is widely used.

Yet, when the polysilicon TFT is used as the driving device, the current technology fails to secure a uniformity of the polysilicon TFT, and a device reliability to drive OELD. And, the current technology also requires at least two TFTs for driving the OELD, thereby failing to secure a sufficient yield as well as realize a large-sized screen. And, the current technology also needs a complicated fabricating process, a high-vacuum process requiring an ultra vacuum environment and an expensive equipment for fine photolithography, and a high cleanness less than class 100, whereby a high cost of production is inevitable.

Meanwhile, at the stage of commercial use is a plasma display panel (hereinafter abbreviated PDP) using a memory function of plasma. Specifically, PDP is more suitable for a wide screen exceeding a size over 42 inches than OELD or Poly-Si TFT display.

FIG. 4 illustrates a schematic bird's-eye view of disassembled upper and lower plates of PDP for pixel areas according to a related art, in which shown is an example of a general AC type 3-electrodes surface discharge PDP disclosed on U.S. Pat. No. 5,420,602, U.S. Pat. No. 5,661, 500, and U.S. Pat. No. 5,674,553. And, the pixel areas of the 3-electrodes surface discharge PDP are shown in the drawing.

And, FIG. 5 schematically illustrates cross-sectional views of the assembled upper and lower plates of PDP shown in FIG. 4 along bisecting lines A–A' and B–B', respectively, in which the cross-sectional views of the upper and lower plates are combined each other in case that the upper plate is rotated clockwise at 90° for the convenience of understanding.

Referring to FIG. 4 and FIG. 5, the pixel areas are provided by a front substrate 41 like a transparent plate such as a glass on an image display surface and a rear substrate 42 placed in parallel with the front substrate 41.

On the front substrate 41 formed are a plurality of transparent sustain electrodes 47 constructing pairs of electrodes X and Y on a surface confronting the rear substrate 42 with uniform intervals therebetween, a plurality of auxiliary sustain electrodes 48 formed on the sustain electrodes 47 respectively so as to reduce resistances of the sustain electrodes 26 respectively, a transparent dielectric layer 49 controlling a discharge current formed on a display (active) area including the auxiliary sustain and sustain electrodes 47 and 48, and a protecting layer 50 on the transparent dielectric layer 49 so as to protect the transparent dielectric layer 49 from plasma etch using of a material such as MgO or the like having a high secondary electron discharge coefficient to help to generate plasma with ease.

Meanwhile, on the rear substrate 42 formed are a plurality of stripe type barrier ribs 43 defining a plurality of discharge spaces so as to cross the sustain electrodes 47 at right angles respectively, a plurality of address electrodes 44 between the barrier ribs 43 so as to cross the sustain electrodes 47 at right angles respectively, a white back dielectric layer 45 covering the entire pixel areas including the address electrodes 44 so as to protect the address electrodes 44 as well as reflect lights emitted from a fluorescent (phosphor) layer 46, and a fluorescent layer 46 on the white back dielectric layer 45 and both inner walls of the respective barrier ribs 43 inside the respective discharge spaces so as to radiate visible rays on plasma discharge. Specifically, in order to increase the contrast ratio when the barrier ribs 43 are formed, lower barrier ribs 43A are firstly formed and then black upper barrier ribs 43B are formed on the lower barrier ribs 43A.

Hg or one of noble gases such as He, Ne, Ar, Xe, Kr, Rn, and the like is used for plasma discharge. And, a mixed gas such as Ne—Xe, Ne—Xe—Ar, or the like is injected into the plasma discharge spaces at a pressure below atmosphere.

Explained in the following is an image display process of a random cell in the above-constructed surface discharge AC type PDP(hereinafter abbreviated AC-PDP) according to a related art.

The image display process mainly includes a total white and erase period carrying out a whole surface discharge and a whole surface erase, an address period bringing about a discharge selectively in accordance with display data, and a sustain period carrying out a sustain discharge on a lighted cell during the address period.

The total white and erase period includes an erase step of discharging a whole surface of the pixel area and removing generated wall charges so as to initialize the whole surface of PDP uniformly and constantly.

In order to discharge the whole surface of the pixel area, an initializing voltage of 150V~300V is applied between the X and Y electrodes constructing the pair of the sustain electrodes (line).

In the discharge space where a 'discharge' is generated, wall charges and charged particles exist. The total white and erase period is completed by applying an erase voltage enough not to generate the discharge to the X and Y electrodes so as to remove the wall charges and charged particles. The erase voltage, using the same potential of the initializing voltage, may be applied thereto for a short period of time so as not to generate the discharge.

The address period is carried out by applying a positive address pulse to the address electrode in order and by applying a negative scan pulse synchronized with the address pulse to the Y electrode in accordance with the display data selectively.

The scan pulse is applied to the pixel area having the display data only but fails to be applied to the pixel area having no display data. As a result, the discharge is generated from the cell to which the address and scan pulses are applied simultaneously. Hence, wall charges are accumulated in the lighted cell.

And, the sustain period generates a plurality of the number of times of 'sustain discharges' from the cell where the wall charges are accumulated by applying sustain discharge pulses to the X and Y electrodes alternately. In this case, a brightness of the corresponding cell is controlled by the number of times (frequency). The sustain discharge pulse should include a discharge voltage and a discharge period so that the discharge occurs in the cell selected during the address period, and vice versa.

However, the 3-electrodes surface discharge PDP excites the inorganic fluorescent material by vacuum UV rays generated from the plasma discharge and uses light irradiated from the inorganic fluorescent material.

Unfortunately, the 3-electrodes surface discharge PDP according to the related art has a decay time amounting to several ~tens ms, thereby showing a residual image when presenting moving pictures.

Moreover, the 3-electrodes surface discharge PDP according to the related art has a low efficiency below 3 lm/W as well as a high driving voltage over 180V, whereby a cost of driving IC is too expensive.

SUMMARY OF THE INVENTION

Accordingly, the present invention is directed to a plasma switched organic electroluminescent display that substantially obviates one or more of the problems due to limitations and disadvantages of the related art.

An object of the present invention is to provide a plasma switched organic electroluminescent display (PSOELD) enabling to emit light by organic electroluminescence having a decay time below several~tens ns as well as drive the display by a low driving voltage below 160V using a plasma discharge as a switch.

Another object of the present invention is to provide a plasma switched organic electroluminescent display (PSOELD) enabling to be fabricated by a simple and easy process using both a general PDP fabricating process and an OELD fabrication process.

Another object of the present invention is to provide a plasma switched organic electroluminescent display (PSOELD) enabling to reduce a cost of production by lowering a driving voltage to use a cheaper driving IC as well as provide a large-sized active type PSOELD with ease.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages, and in accordance with the purpose of the present invention as embodied and broadly described, a plasma switched organic electroluminescent display according to the present invention includes an electroluminescent part including a cathode layer, an electroluminescent layer on the cathode layer, and an anode layer on the electroluminescent layer, a first power supply unit connected electrically to the anode layer and disconnected electrically to the cathode layer so as to supply the electroluminescent layer with a first power, a plasma generating part generating a plasma wherein the plasma becomes contacted with the cathode layer, and a second power supply unit generating the plasma by supplying the plasma generating part with a second power, wherein the cathode layer is connected electrically to the first power supply unit through the plasma.

Preferably, the plasma switched electroluminescent display further includes an address electrode installed between the plasma generating part and the first power supply unit so as to connect the cathode layer electrically to the first power supply unit through the plasma.

Preferably, the first power is applied to the cathode layer by the plasma via the address electrode, and the cathode layer is a floating electrode.

Preferably, the electroluminescent layer is selected from the group consisting of high molecular organic electroluminescent material, low molecular electroluminescent material using fluorescence, and low molecular electroluminescent material using phosphorescence.

In another aspect of the present invention, a plasma switched organic electroluminescent display includes upper and lower plates. The lower plate includes a first substrate, a plurality of sustain electrodes arranged on the first substrate in parallel with each other so as to construct a plurality of sustain electrode pairs wherein each of the sustain electrode pairs comprises a pair of the sustain electrodes adjacent to each other, a dielectric layer on the first substrate including the sustain electrodes, and a plurality of barrier ribs formed on the dielectric layer to define a plurality of pixel areas constructing a plurality of rows and columns so that each of the sustain electrode pairs is placed in the corresponding row or column. The upper plate includes a second substrate, a plurality of address electrodes arranged on the second substrate so as to leave a predetermined interval each other wherein the address electrodes cross the sustain electrodes at right angles, a plurality of anode layers arranged on the second substrate so as to be placed next to the address electrodes in the pixel areas, a plurality of inner insulating/separating layers formed on the second substrate, each of the inner insulating/separating layers having an address electrode opening exposing the corresponding address electrode and an anode opening exposing the corresponding anode, a plurality of electroluminescent layers formed on the inner insulating/separating layers in the pixel areas, each of the electroluminescent layers contacted with the corresponding anode layer exposed through the anode opening, and a plurality of cathode layers formed on the electroluminescent layers.

Preferably, the plasma switched organic electroluminescent display further includes a protecting layer formed of MgO on the dielectric layer.

Preferably, the anode layers are selected from the group consisting of ITO (indium tin oxide) and IZO (indium zinc oxide).

Preferably, each of the anode openings extends to edges of a top of the corresponding anode layer so as to increase an aperture ratio of the display.

Preferably, the electroluminescent layers are formed by a means selected from the group consisting of screen print, ink-jet print, dry film laminate, and vacuum evaporation using a shadow mask.

Preferably, the plasma switched organic electroluminescent display further includes a plurality of hole injection layers and a plurality of hole transport layers stacked in order between the anode layers and the electroluminescent layers, a plurality of hole blocking layers formed on the electroluminescent layers, and a plurality of electron transport layers formed on the hole blocking layers.

In a further aspect of the;present invention, a plasma switched organic electroluminescent display includes upper and lower plates. The lower plate includes a first substrate, a plurality of sustain electrodes arranged on the first substrate in parallel with each other so as to construct a plurality of sustain electrode pairs wherein each of the sustain electrode pairs comprises a pair of the sustain electrodes adjacent to each other, a dielectric layer on the first substrate including the sustain electrodes, a plurality of barrier ribs formed on the dielectric layer to define a plurality of pixel areas constructing a plurality of rows and columns so that each of the sustain electrode pairs is placed in the corresponding row or column, a protecting layer covering the dielectric layer exposed between the barrier ribs, and a plurality of exposed electrodes running in parallel with each other on portions of the protecting layer corresponding to middle parts of the sustain electrode pairs. The upper plate includes a second substrate, a plurality of address electrodes arranged on the second substrate so as to leave a predetermined interval each other wherein the address electrodes cross the sustain electrodes at right angles, a plurality of anode layers arranged on the second substrate so as to be placed next to the address electrodes in the pixel areas, a plurality of inner insulating/separating layers formed on the second substrate, each of the inner insulating/separating layers having an anode opening exposing the corresponding anode layer, a plurality of electroluminescent layers formed on the inner insulating/separating layers in the pixel areas, each of the electroluminescent layers contacted with the corresponding anode layer exposed through the anode opening, and a plurality of cathode layers formed on the electroluminescent layers.

Preferably, each of the-anode openings extends to edges of a top of the corresponding anode layer so as to increase an aperture ratio of the display.

Preferably, the electroluminescent layers are formed by a means selected from the group consisting of screen print, ink-jet print, dry film laminate, and vacuum evaporation using a shadow mask.

Preferably, the plasma switched organic electroluminescent display further includes a plurality of hole injection layers and a plurality of hole transport layers stacked in order between the anode layers and the electroluminescent layers, a plurality of hole blocking layers formed on the electroluminescent layers, and a plurality of electron transport layers formed on the hole blocking layers.

In another further aspect of the present invention, a plasma switched organic electroluminescent display includes upper and lower plates. The lower plate includes a first substrate, a plurality of sustain electrodes arranged on the first substrate in parallel with each other so as to construct a plurality of sustain electrode pairs wherein each of the sustain electrode pairs comprises a pair of the sustain electrodes adjacent to each other, a dielectric layer on the first substrate including the sustain electrodes, and a plurality of barrier ribs formed on the dielectric layer to define a plurality of pixel areas constructing a plurality of rows and columns so that each of the sustain electrode pairs is placed in the corresponding row or column. The upper plate includes a second substrate, a plurality of address electrodes arranged on the second substrate so as to leave a predetermined interval each other wherein the address electrodes cross the sustain electrodes at right angles, a plurality of exposed electrodes in parallel with each other on the second substrate between the address electrodes, a plurality of anode layers arranged on the second substrate so as to be placed between the address electrodes and the exposed electrodes in the pixel areas, a plurality of inner insulating/separating layers formed on the second substrate including the address electrodes and the anode layers except the exposed electrodes, each of the inner insulating/separating layers having an anode opening exposing the corresponding anode layer, a plurality of electroluminescent layers formed on the inner insulating/separating layers in the pixel areas, each of the electroluminescent layers contacted with the corresponding anode layer exposed through the anode opening, and a plurality of cathode layers formed on the electroluminescent layers.

Preferably, each of the anode openings extends to edges of a top of the corresponding anode layer so as to increase an aperture ratio of the display.

Preferably, the electroluminescent layers are formed by a means selected from the group consisting of screen print, ink-jet print, dry film laminate, and vacuum evaporation using a shadow mask.

Preferably, the plasma switched organic electroluminescent display further includes a plurality of hole transport layers inserted between the anode layers and the electroluminescent layers.

More preferably, the plasma switched organic electroluminescent display further includes a plurality of hole injection layers inserted between the anode layers and the hole transport layers.

Preferably, the plasma switched organic electroluminescent display further includes a plurality of electron transport layers inserted between the electroluminescent layers and the cathode layers.

More preferably, the plasma switched organic electroluminescent display further includes a plurality of hole blocking layers inserted between the electroluminescent layers and the electron transport layers.

Preferably, the plasma switched organic electroluminescent display further includes a protecting layer formed of MgO on the dielectric layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
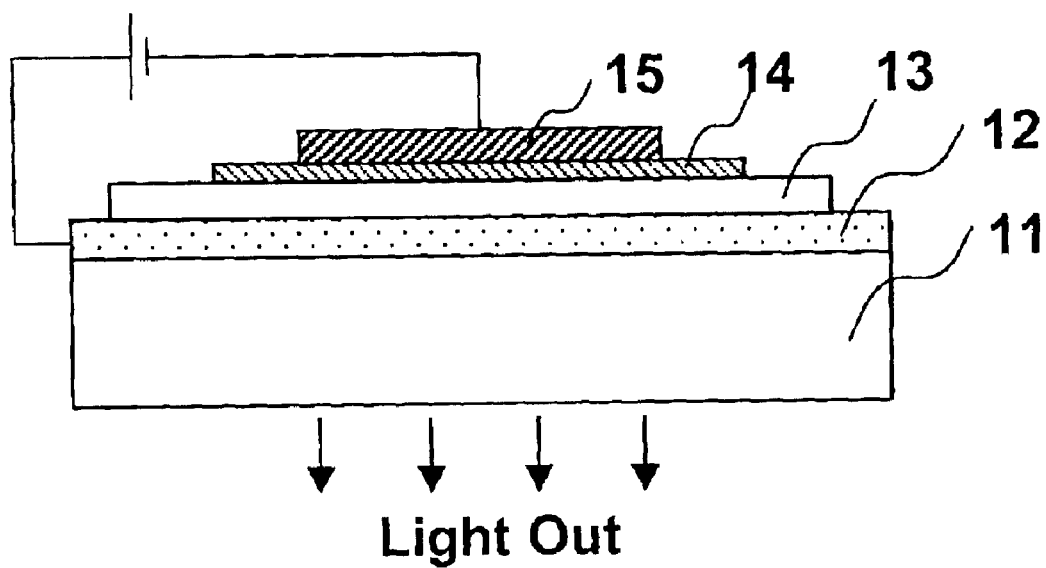
FIG. 1 illustrates a cross-sectional view of a basic construction of OELD using a high molecular electroluminescent material according to a related art.
Figure 2:
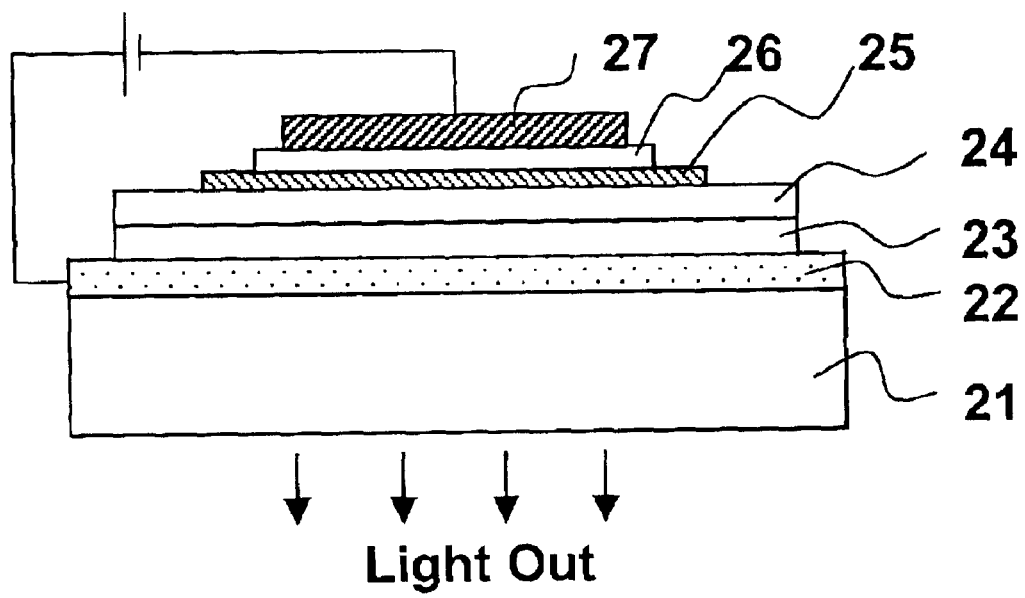
FIG. 2 illustrates a cross-sectional view of a basic construction of OELD using a low molecular electroluminescent material for fluorescence according to a related art.
Figure 3:
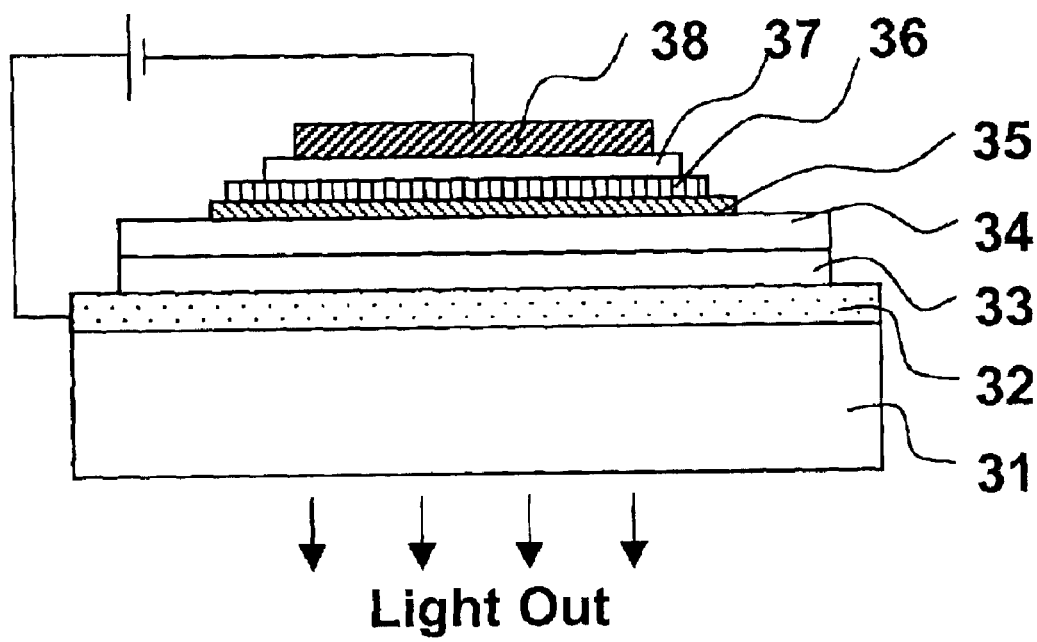
FIG. 3 illustrates a cross-sectional view of a basic construction of OELD using a low molecular electroluminescent material for phosphorescence according to a related art.
Figure 4:
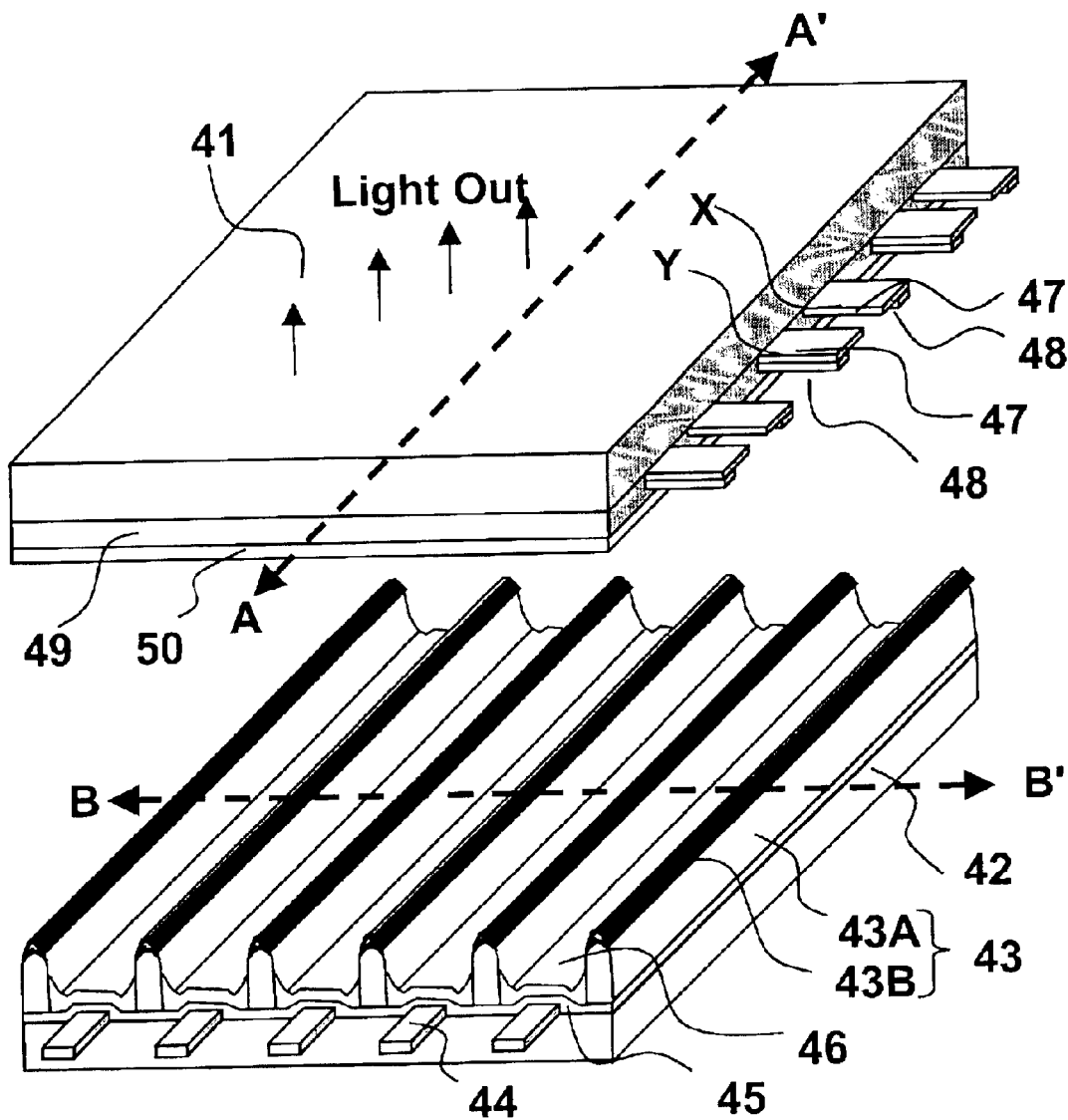
FIG. 4 illustrates a schematic bird's-eye view of disassembled upper and lower plates of PDP according to a related art.
Figure 5:
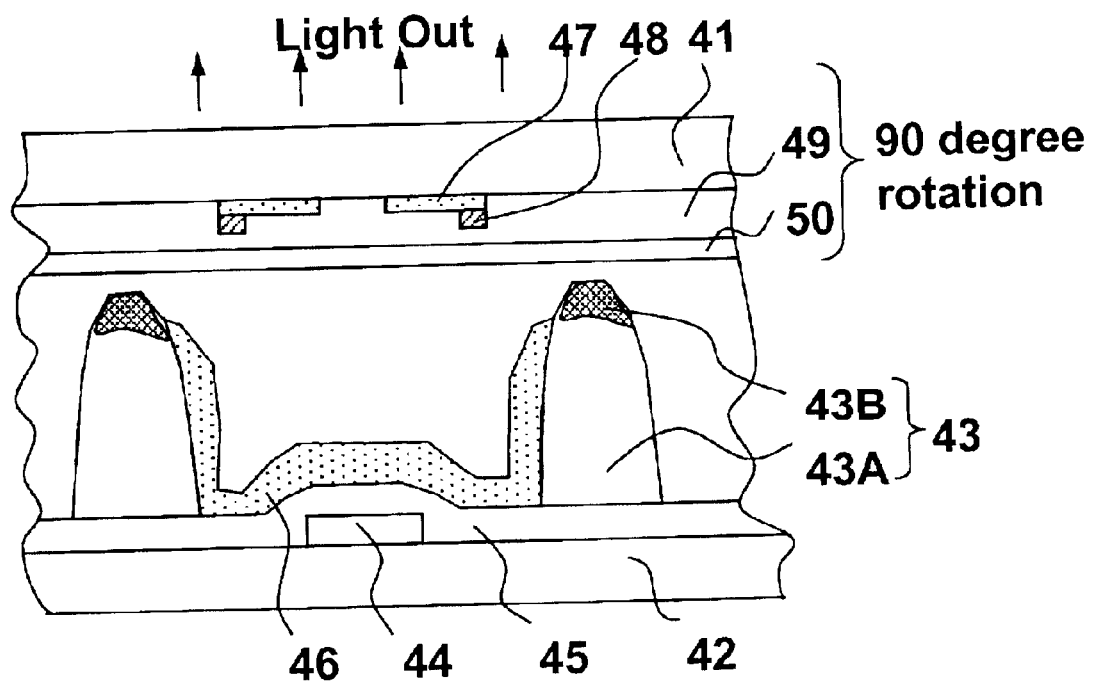
FIG. 5 illustrates schematically cross-sectional views of the upper and lower plates of PDP shown in FIG. 4 along bisecting lines A–A' and B–B', respectively.

Reference will now be made in detail to the preferred embodiments of the present invention, examples of which are illustrated in the accompanying drawings. Where possible, the same reference numerals will be used to illustrate like elements throughout the specification. And, detailed component materials and techniques of the embodiments of the present invention include all those used for the related art.

First Embodiment

A plasma switched organic electroluminescent display (hereinafter abbreviated PSOELD) and a fabricating method thereof according to a first embodiment of the present invention are described as follows.

Figure 6:
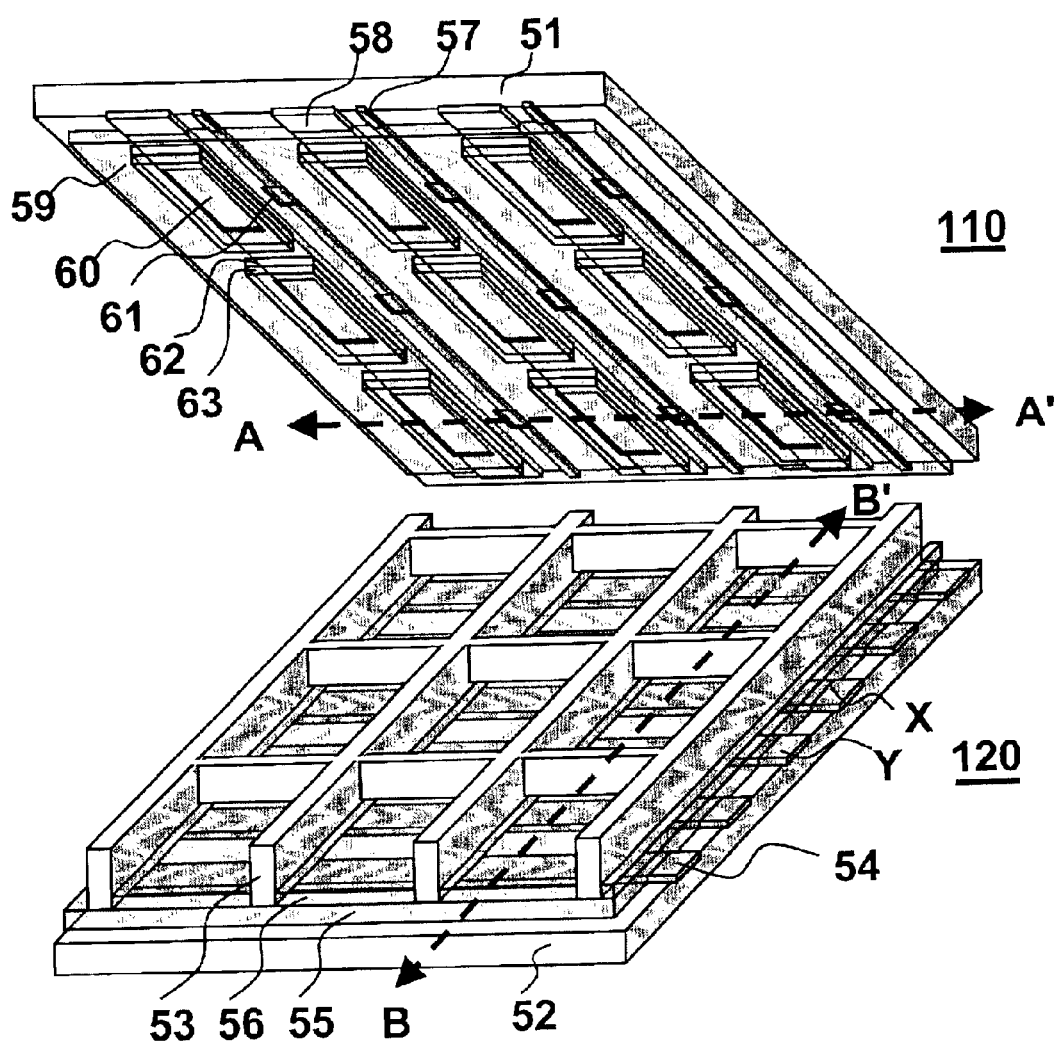
FIG. 6 illustrates a schematic bird's-eye view of PSOELD according to a first embodiment of the present invention.
Figure 7:
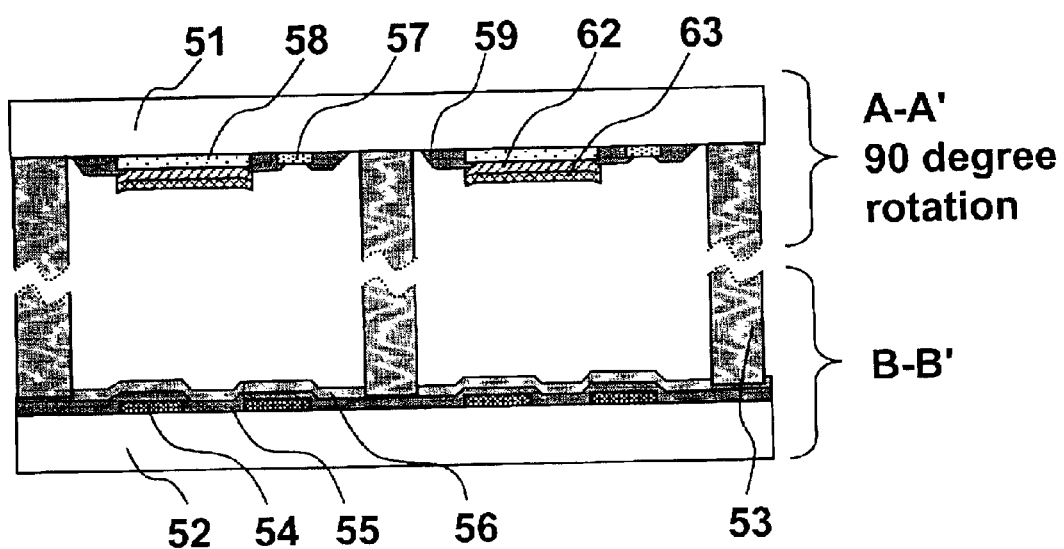
FIG. 7 illustrates schematically cross-sectional views of upper and lower plates of PSOELD shown in FIG. 6 along bisecting lines A–A' and B–B', respectively.

FIG. 6 illustrates a schematic bird's-eye view of PSOELD according to a first embodiment of the present invention, and FIG. 7 illustrates schematically cross-sectional views of upper and lower plates of PSOELD shown in FIG. 6 along bisecting lines A–A' and B–B', respectively. And, FIG. 7 schematically illustrates cross-sectional views of the assembled upper and lower plates of PSOELD shown in FIG. 6, in which the cross-sectional views of upper and lower plates are combined each other in case that the upper plate is rotated clockwise at 90° for the convenience of understanding.

Referring to FIG. 6 and FIG. 7, PSOELD according to the first embodiment of the present invention includes an upper plate 110 and a lower plate 120.

The lower plate 120 includes a rear substrate 52, sustain electrodes 54, a dielectric layer 55, barrier ribs 53, and protecting layers 56. And, the upper plate 110 includes a front substrate 51, address electrodes 57, anode layers 58, inner insulating/separating layers 59, anode contact holes 60, address electrode contact holes 61, electroluminescent layers 62, and cathode layers 63.

On the rear substrate 52 confronting to the front substrate 51, a plurality of the sustain electrodes 54 are formed in parallel with each other like stripes by photolithography. In this case, every two X and Y of the sustain electrodes 54 construct a plurality of sustain electrode pairs. The sustain electrode X leaves an interval with the other sustain electrode Y as long as several tens~several hundreds μm, and the sustain electrodes 54 are several hundreds μm wide.

The dielectric layer 55 restricting a discharge current is formed on the rear substrate 52 several~several tens μm thick by screen print so as to cover the exposed surfaces of the sustain electrodes 54.

A plurality of the barrier ribs 53 are formed several hundreds μm tall on the dielectric layer 55 by repeating screen print about ten times so as to interrupt spaces to prevent a plasma discharge from diffusing into other cells. In this case, the barrier ribs 53 are formed to provide a lattice structure including a plurality of lattices so that a pair of the sustain electrodes 54 constructing the sustain electrode pair is placed in specific ones of the corresponding discharge spaces in the same row or column of the lattice structure.

And, a plurality of the protecting layers 56 are formed on the exposed surface of the dielectric layer 55 between the barrier ribs 53 by vacuum evaporation using MgO or the like having a high secondary electron discharge coefficient to protect the dielectric layer 55 from plasma etch as well as make a plasma occur with ease.

Meanwhile, as mentioned in the foregoing description, the upper plate 110 includes a front substrate 51, address electrodes 57, anode layers 58, inner insulating/separating layers 59, anode contact holes 60, address electrode contact holes 61, electroluminescent layers 62, and cathode layers 63.

On the front substrate 51 confronting the lower plate 120, a plurality of the address electrodes 57 are formed in parallel with each other like stripes crossing the sustain electrodes 54 of the lower plate 120 by patterning a conductive metal by photolithography.

A plurality of anode layers 58 like stripes in parallel wish each other are formed on the front substrate 51 between the address electrodes 57, using a transparent conductive material such as ITO (indium tin oxide), IZO (indium zinc oxide), or the like.

In order to increase a contrast ratio by cutting off light from a plasma discharge, a plurality of the inner insulating/separating layers 59 formed of a black material are formed on the front substrate 51 including the address electrodes 57 and anode layers 58.

In the inner insulating/separating layers 59 corresponding to the discharge spaces of the lower plate 120, a plurality of the through-hole type anode contact holes 60 and address electrode contact holes 61 exposing portions of the anode layers 58 and address electrodes 57 are formed.

In this case, each of the anode contact holes 60 is formed to have a maximum exposed central area of the anode layer 58 corresponding to the pixel area defined by the corresponding barrier ribs 53, thereby enabling to prevent the anode layer 58 from being electrically connected to the cathode layer 63 right over the anode layer 58.

Besides, each of the address electrode contact holes 61 is formed next to the corresponding anode contact hole 60 so as to expose a portion of the corresponding address electrode 57 in the discharge space defined by the corresponding barrier ribs 53. And, each size of the address electrode contact holes 61 is smaller than that of the anode contact holes 60.

Furthermore, the inner insulating/separating layers 59, anode contact holes 60, and address electrode contact holes 61 are formed by photolithography. And, the anode contact holes 60 and address electrode contact holes 61 are formed in the discharge spaces defined by the barrier ribs 53.

A plurality of the electroluminescent layers 62 are formed on the inner insulating/separating layers 59 including the anode contact holes 60. In this case, each of the electroluminescent layers 62 is formed rectangular enough to cover the corresponding anode contact hole 60.

And, a plurality of the cathode layers 63 formed of a conductive metal such as Al or the like are formed on the electroluminescent layers 62, by vacuum evaporation.

In this case, the electroluminescent layers 62 are selected from the group consisting of high molecular organic electroluminescent material, low molecular electroluminescent material using fluorescence, low molecular electroluminescent material using phosphorescence, and the like.

The upper and lower plates 110 and 120 are aligned so that each of the anode contact holes 60 and address electrode contact holes 61 are placed between the corresponding barrier ribs 53 as well as confront the corresponding sustain electrode pair X and Y. A mixed gas of Ne—Xe or Ne—Xe—Ar is injected into the respective discharge spaces between the barrier ribs 53 at a pressure below atmosphere, thereby enabling to generate plasma. For instance, the mixed gas of Ne(96%)—Xe(4%) is injected at 500 torr to generate plasma.

When the electroluminescent layers 62 are formed of the high molecular organic electroluminescent material by inkjet or screen print, hole transport layers are further formed on the anode layers 58 so that the electroluminescent layers 62 are preferably placed on the hole transport layers.

When the electroluminescent layers 62 are formed of the low molecular organic electroluminescent material using fluorescence by vacuum evaporation, both hole injection layers and hole transport layers are further inserted between the anode layers 58 and the electroluminescent layers 62, and electron transport layers are further inserted between the electroluminescent layers 62 and the cathode layers 63.

And, When the electroluminescent layers 62 are formed of the low molecular organic electroluminescent material using phosphorescence by vacuum evaporation, both hole injection layers and hole transport layers are further inserted between the anode layers 58 and the electroluminescent layers 62, and both hole blocking layers and electron transport layers are further inserted between the electroluminescent layers 62 and the cathode layers 63.

Figure 8A:
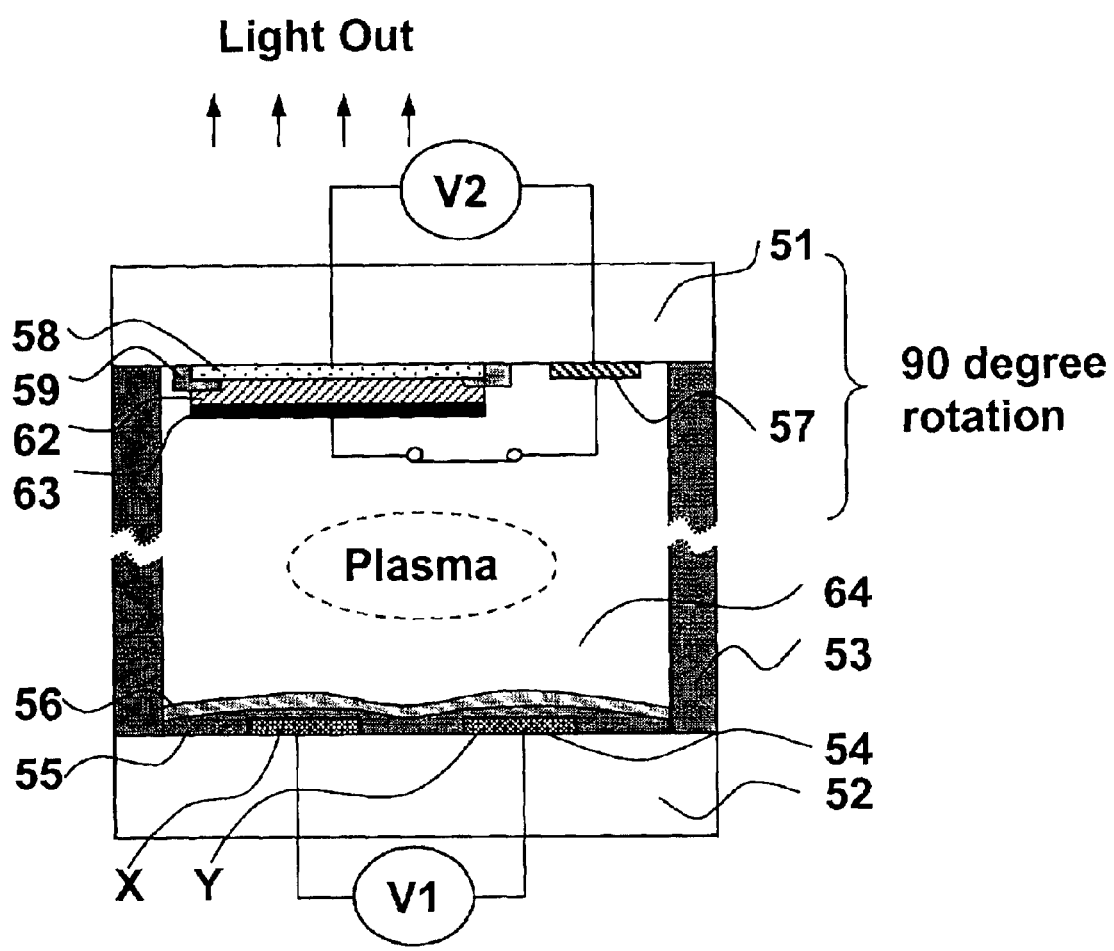
FIG. 8A illustrates a cross-sectional diagram for explaining a plasma generated from a plasma discharge space in PSOELD according to the present invention.
Figure 8B:
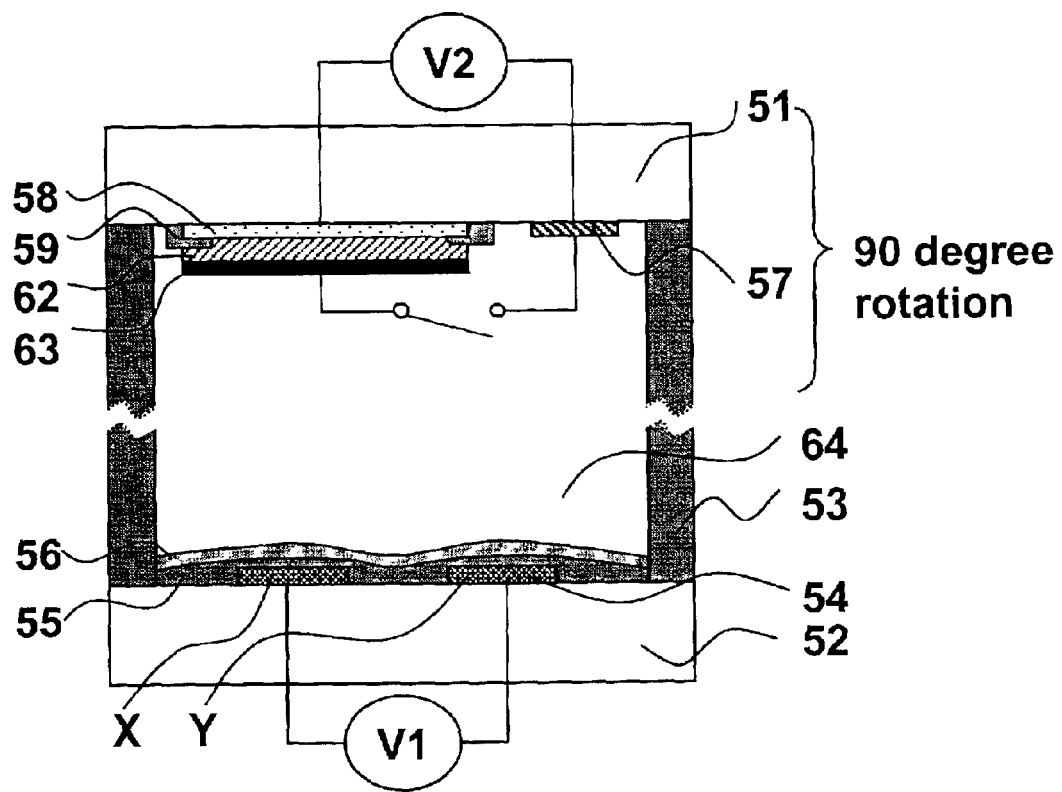
FIG. 8B illustrates a cross-sectional diagram for explaining a plasma failing to occur in a plasma discharge space in PSOELD according to the present invention.

FIG. 8A illustrates a cross-sectional diagram for explaining a plasma generated from a plasma discharge space in PSOELD according to the present invention, and FIG. 8B illustrates a cross-sectional diagram for explaining a plasma failing to occur in a plasma discharge space in PSOELD according to the present invention. In FIG. 8A and FIG. 8B using the same numerals in FIG. 6 and FIG. 7, the cross-sectional views of upper and lower plates are combined each other in case that the upper plate is rotated clockwise at 90° for the convenience of understanding.

Referring to FIG. 8A and FIG. 8B, the organic electroluminescent layer 62 is inserted between the anode and cathode layers 58 and 63. And, the plasma discharge space 64, from which plasma is generated, is defined by the cathode layer 63, address electrode 57, protecting layer 56, and barrier ribs 53 surrounding the protecting layer 56.

Through the total white and erase period and the address period applied generally to a 3-electrodes surface discharge structure for operating PSOELD, when a sustain voltage is applied to a first power source V1 while wall charges are formed on the protecting layer 56 in the cell selected by the address period, plasma PLASMA, as shown in FIG. 8A, is generated in the plasma discharge space 64 so that the cathode layer 63 is electrically connected (turned on) to the address electrode 57 through the generated plasma PLASMA. Hence, the organic electroluminescent layer 62 emits light by a second power source V2.

Yet, another cell unselected by the address period fails to form wall charges on the protecting layer 56, thereby being unable to generate the plasma in the plasma discharge space 64 despite applying the sustain voltage to the first power source V1. Thus, the cathode layer 63 and the address electrode 57 maintains turned off, whereby the organic electroluminescent layer 62 fails to emit light.

Therefore, the plasma occurrence in the plasma discharge space 64 functions as a switch determining whether the organic electroluminescent layer 62 emits light or not.

Second Embodiment

Figure 9:
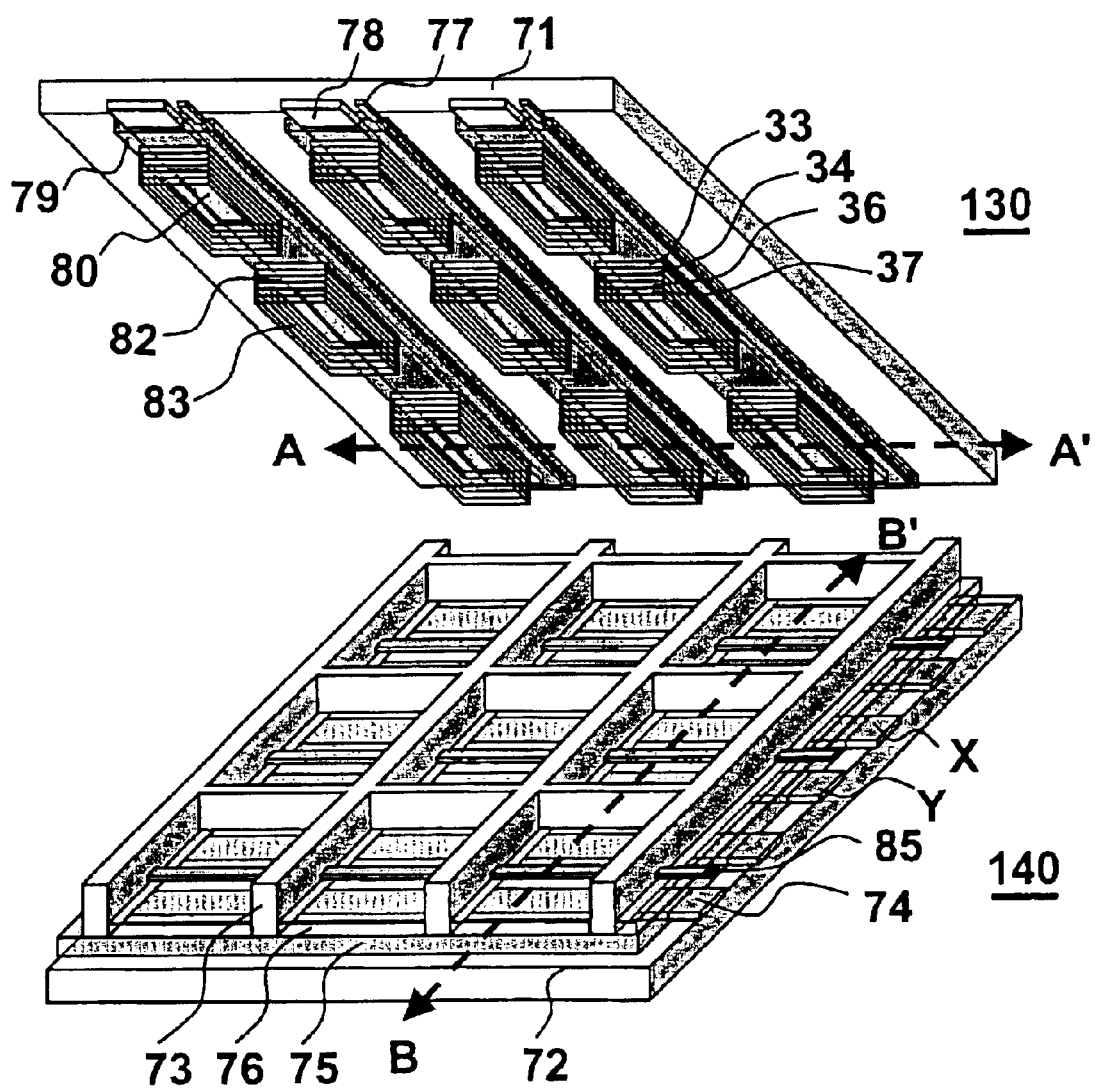
FIG. 9 illustrates a schematic bird's-eye view of PSOELD according to a second embodiment of the present invention.
Figure 10:
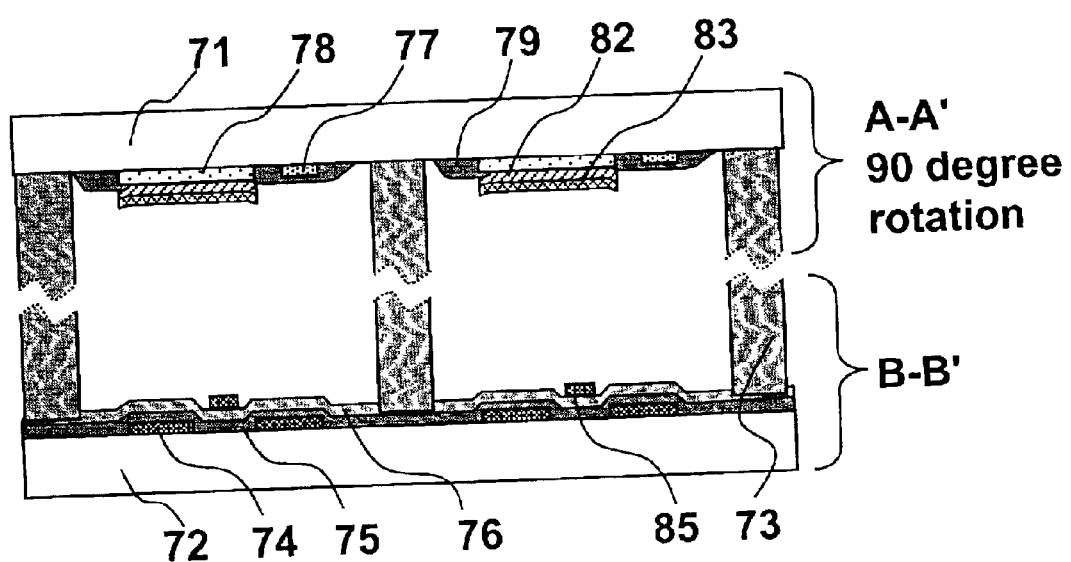
FIG. 10 illustrates schematically cross-sectional views of upper and lower plates of PSOELD shown in FIG. 9 along bisecting lines A–A' and B–B', respectively.

FIG. 9 illustrates a schematic bird's-eye view of PSOELD according to a second embodiment of the present invention, and FIG. 10 illustrates schematically cross-sectional views of upper and lower plates of PSOELD shown in FIG. 9 along bisecting lines A–A' and B–B', respectively. And, FIG. 10 schematically illustrates cross-sectional views of the assembled upper and lower plates of PSOELD shown in FIG. 9, in which the cross-sectional views of upper and lower plates are combined each other in case that the upper plate is rotated clockwise at 90° for the convenience of understanding.

Referring to FIG. 9 and FIG. 10, PSOELD according to the second embodiment of the present invention includes an upper plate 130 and a lower plate 140.

The lower plate 140 includes a rear substrate 72, sustain electrodes 74, a dielectric layer 75, barrier ribs 73, protecting layers 76, and exposed electrodes 85. And, the upper plate 130 includes a front substrate 71, address electrodes 77, anode layers 78, inner insulating/separating layers 79, anode contact holes 80, electroluminescent layers 82, and cathode layers 83.

On the rear substrate 72 confronting to the front substrate 71, a plurality of the sustain electrodes 74 are formed in parallel with each other like stripes by photolithography. In this case, every two X and Y of the sustain electrodes 74 construct a plurality of sustain electrode pairs. The sustain electrode X leaves an interval with the other sustain electrode Y as long as several tens~several hundreds $\mu$m, and each of the sustain electrodes 54 is several hundreds $\mu$m wide.

The dielectric layer 75 restricting a discharge current is formed on the rear substrate 72 several~several tens $\mu$m thick by screen print so as to cover the exposed surfaces of the sustain electrodes 74.

A plurality of the barrier ribs 73 are formed several hundreds $\mu$m tall on the dielectric layer 75 by repeating screen print about ten times so as to interrupt spaces to prevent a plasma discharge from diffusing into other cells. In this case, the barrier ribs 73 are formed to provide a lattice structure including a plurality of lattices so that a pair of the sustain electrodes 74 constructing the sustain electrode pair is placed in specific ones of the corresponding discharge spaces in the same row or column of the lattice structure.

A plurality of the protecting layers 76 are formed on the exposed surface of the dielectric layer 75 between the barrier ribs 73 by vacuum evaporation using MgO or the like having a high secondary electron discharge coefficient to protect the dielectric layer 75 from plasma etch as well as make a plasma occur with ease.

And, a plurality of the exposed electrodes 85 are formed on the protecting layers 76 overlapped with the middle parts between the two sustain electrodes 74 constructing the sustain electrode pair X and Y in the discharge spaces. In this case, the exposed electrodes 85 are formed by vacuum evaporation using a shadow mask so as to be arranged on the protecting layers like stripes in parallel with the sustain electrodes 74.

Meanwhile, as mentioned in the foregoing description, the upper plate 130 includes the front substrate 71, address electrodes 77, anode layers 78, inner insulating/separating layers 79, anode contact holes 80, electroluminescent layers 82, and cathode layers 83.

On the front substrate 71 confronting the lower plate 140, a plurality of the address electrodes 77 are formed in parallel with each other like stripes crossing the sustain electrodes 74 of the lower plate 140 at right angles by patterning a conductive metal by photolithography.

A plurality of anode layers 78 like stripes in parallel with the address electrodes 77 are formed on the front substrate 71 between the address electrodes 77, using a transparent conductive material such as ITO(indium tin oxide), IZO (indium zinc oxide), or the like.

In order to increase a contrast ratio by cutting off light from a plasma discharge, a plurality of the inner insulating/separating layers 79 formed of a black material are formed on the front substrate 51 including the address electrodes 77 and anode layers 78.

In the inner insulating/separating layers 79 corresponding to the discharge spaces of the lower plate 140, a plurality of the through-hole type anode contact holes 80 exposing portions of the anode layers 78 are formed.

In this case, each of the anode contact holes 80 is formed to have a maximum exposed central area of the anode layer 78 corresponding to the pixel area defined by the corresponding barrier ribs 73, thereby enabling to prevent the anode layer 78 from being electrically connected(shorted) to the cathode layer 83 over the anode layer 78.

Besides, the inner insulating/separating layers 79 and anode contact holes 80 are formed by photolithography. And, the anode contact holes 80 are formed in the discharge spaces defined by the barrier ribs 73.

A plurality of the electroluminescent layers 82 are formed on the inner insulating/separating layers 79 including the anode contact holes 80. In this case, each of the electroluminescent layers 82 is formed rectangular enough to cover the corresponding anode contact hole 80.

And, a plurality of the cathode layers 83 formed of a conductive metal such as Al or the like are formed on the electroluminescent layers 82, by vacuum evaporation.

In this case, the electroluminescent layers 82 are selected from the group consisting of high molecular organic electroluminescent material, low molecular electroluminescent material using fluorescence, low molecular electroluminescent material using phosphorescence, and the like.

The upper and lower plates 130 and 140 are aligned so that each of the anode contact holes 80 is placed between the corresponding barrier ribs 73 as well as confronts the corresponding sustain electrode pair X and Y. A mixed gas of Ne—Xe or Ne—Xe—Ar is injected into the respective discharge spaces between the barrier ribs 73 at a pressure below atmosphere, thereby enabling to generate plasma. For instance, the mixed gas of Ne(96)—Xe(4%) is injected at 500 torr to generate plasma.

When the electroluminescent layers 82 are formed of the high molecular organic electroluminescent material by inkjet or screen print, hole transport layers are further formed on the anode layers 78 so that the electroluminescent layers 82 are preferably placed on the hole transport layers.

When the electroluminescent layers 82 are formed of the low molecular organic electroluminescent material using fluorescence by vacuum evaporation, both hole injection layers and hole transport layers are further inserted between the anode layers 78 and the electroluminescent layers 82, and electron transport layers are further inserted between the electroluminescent layers 82 and the cathode layers 83.

And, When the electroluminescent layers 82 are formed of the low molecular organic electroluminescent material using phosphorescence by vacuum evaporation, both hole injection layers and hole transport layers are further inserted between the anode layers 78 and the electroluminescent layers 82, and both hole blocking layers and electron transport layers are further inserted between the electroluminescent layers 82 and the cathode layers 83.

Third Embodiment

Figure 11:
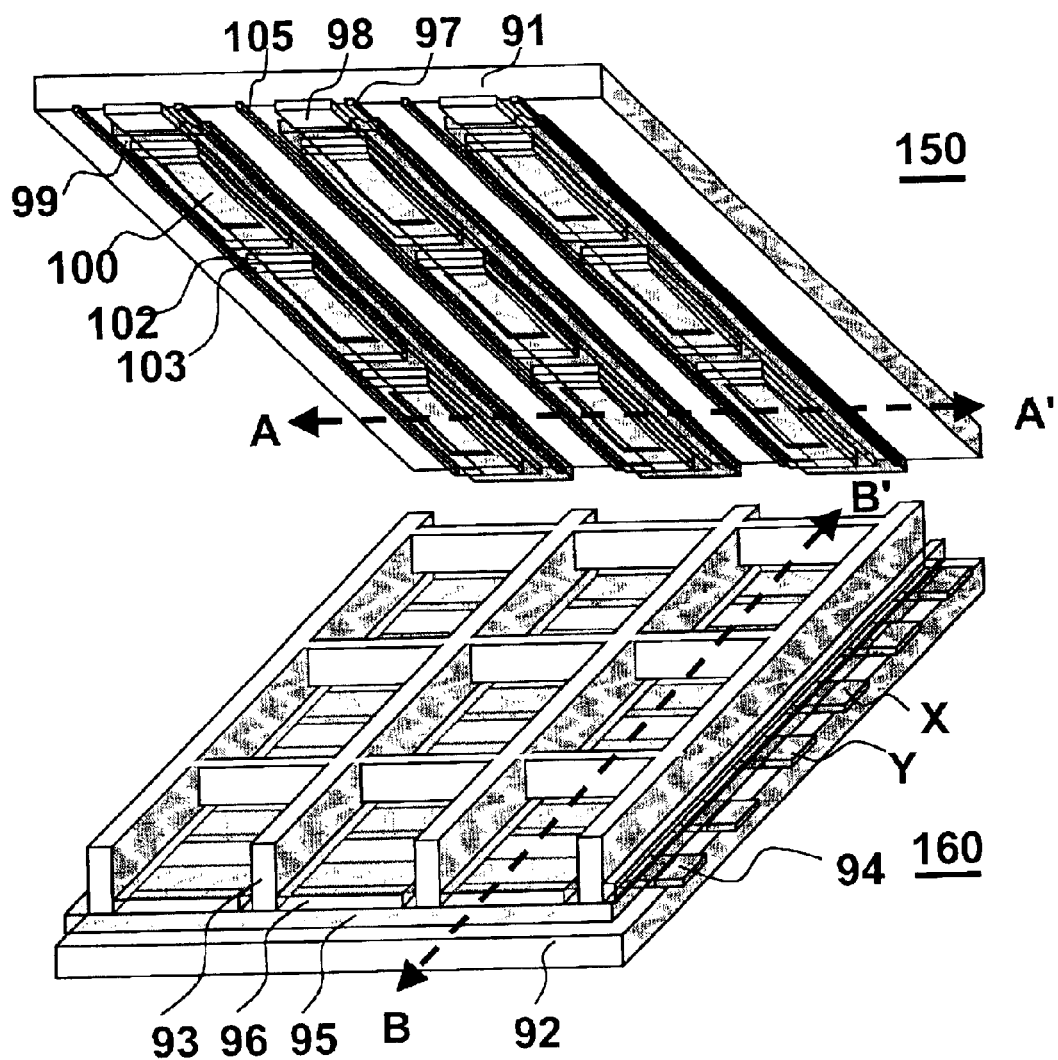
FIG. 11 illustrates a schematic bird's-eye view of PSOELD according to a third embodiment of the present invention.
Figure 12:
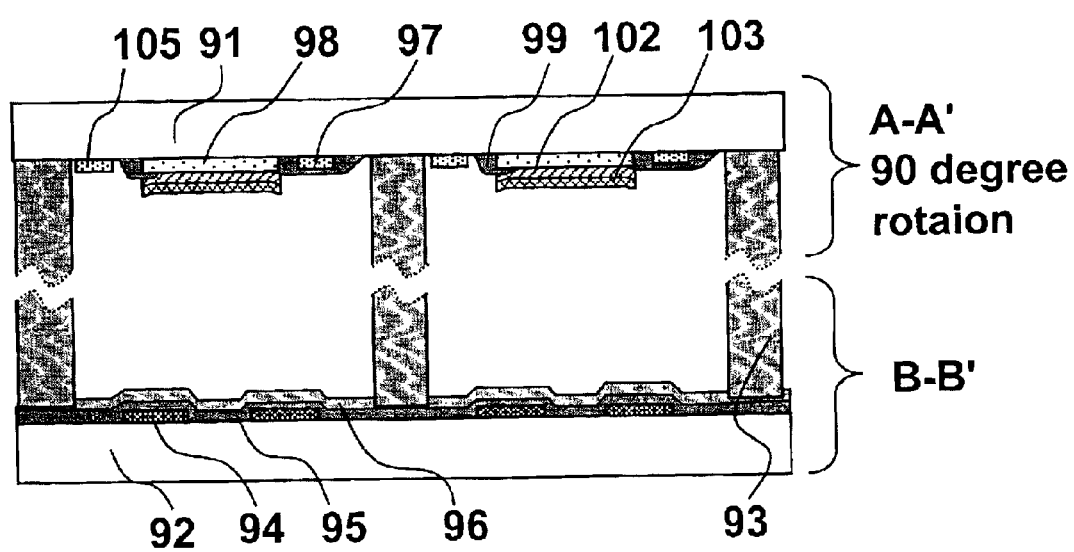
FIG. 12 illustrates schematically cross-sectional views of upper and lower plates of PSOELD shown in FIG. 11 along bisecting lines A–A' and B–B', respectively.

FIG. 11 illustrates a schematic bird's-eye view of PSOELD according to a third embodiment of the present invention, and FIG. 12 illustrates schematically cross-sectional views of upper and lower plates of PSOELD shown in FIG. 11 along bisecting lines A–A' and B–B', respectively. And, FIG. 12 schematically illustrates cross-sectional views of the assembled upper and lower plates of PSOELD shown in FIG. 11, in which the cross-sectional views of upper and lower plates are combined each other in case that the upper plate is rotated clockwise at 90° for the convenience of understanding.

Referring to FIG. 11 and FIG. 12, PSOELD according to the third embodiment of the present invention includes an upper plate 150 and a lower plate 160.

The lower plate 160 includes a rear substrate 92, sustain electrodes 94, a dielectric layer 95, barrier ribs 93, and protecting layers 96. And, the upper plate 150 includes a front substrate 91, address electrodes 97, anode layers 98, inner insulating/separating layers 99, anode contact holes 100, electroluminescent layers 102, cathode layers 103, and exposed electrodes 105.

On the rear substrate 92 confronting to the front substrate 91, a plurality of the sustain electrodes 94 are formed in parallel with each other like stripes by photolithography. In this case, every two X and Y of the sustain electrodes 94 construct a plurality of sustain electrode pairs. The sustain electrode X leaves an interval with the other sustain electrode Y as long as several tens~several hundreds $\mu$m, and the sustain electrodes 94 are several hundreds $\mu$m wide.

The dielectric layer 95 restricting a discharge current is formed on the rear substrate 92 several~several tens $\mu$m thick by screen print so as to cover the exposed surfaces of the sustain electrodes 94.

A plurality of the barrier ribs 93 are formed several hundreds $\mu$m tall on the dielectric layer 95 by repeating screen print about ten times so as to interrupt spaces to prevent a plasma discharge from diffusing into other cells. In this case, the barrier ribs 93 are formed to provide a lattice structure including a plurality of lattices so that a pair of the sustain electrodes 94 constructing the sustain electrode pair is placed in specific ones of the corresponding discharge spaces in the same row or column of the lattice structure.

And, a plurality of the protecting layers 96 are formed on the exposed surface of the dielectric layer 95 between the barrier ribs 93 by vacuum evaporation using MgO or the like having a high secondary electron discharge coefficient to protect the dielectric layer 95 from plasma etch as well as make a plasma occur with ease.

Meanwhile, as mentioned in the foregoing description, the upper plate 150 includes the front substrate 91, address electrodes 97, anode layers 98, inner insulating/separating layers 99, anode contact holes 100, electroluminescent layers 102, cathode layers 103, and exposed electrodes 105.

On the front substrate 91 confronting the lower plate 160, a plurality of the address electrodes 97 and exposed electrodes 105 are formed alternately in parallel with each other like stripes crossing the sustain electrodes 94 of the lower plate 160 at right angles by patterning a conductive metal by photolithography.

A plurality of anode layers 98 like stripes between and in parallel with the address electrodes 97 and the exposed electrodes 105 are formed on the front substrate 91, using a transparent conductive material such as ITO (indium tin oxide), IZO (indium zinc oxide), or the like.

In order to increase a contrast ratio by cutting off light from a plasma discharge, a plurality of the inner insulating/separating layers 99 formed of a black material are formed on the front substrate 91 including the address electrodes 77 and anode layers 78 so as to expose the exposed electrodes 105.

In the inner insulating/separating layers 99 corresponding to the discharge spaces of the lower plate 160, a plurality of the through-hole type anode contact holes 100 exposing portions of the anode layers 98 are formed.

In this case, each of the anode contact holes 100 is formed to have a maximum exposed central area of the anode layer 98 corresponding to the pixel area defined by the corresponding barrier ribs 93, thereby enabling to prevent the anode layer 98 from being electrically connected(shorted) to the corresponding cathode layer 103 over the anode layer 98.

Besides, the inner insulating/separating layers 99 and anode contact holes 100 are formed by photolithography. And, the anode contact holes 100 are formed in the discharge spaces defined by the barrier ribs 93.

A plurality of the electroluminescent layers 102 are formed on the inner insulating/separating layers 99 including the anode contact holes 100. In this case, each of the electroluminescent layers 102 is formed rectangular enough to cover the corresponding anode contact hole 100.

And, a plurality of the cathode layers 103 formed of a conductive metal such as Al or the like are formed on the electroluminescent layers 102, by vacuum evaporation.

In this case, the electroluminescent layers 102 are selected from the group consisting of high molecular organic electroluminescent material, low molecular electroluminescent material using fluorescence, low molecular electroluminescent material using phosphorescence, and the like.

The upper and lower plates 150 and 160 are aligned so that each of the anode contact holes 100 is placed between the corresponding barrier ribs 93 as well as confronts the corresponding sustain electrode pair X and Y. A mixed gas of Ne—Xe or Ne—Xe—Ar is injected into the respective discharge spaces between the barrier ribs 93 at a pressure below atmosphere, thereby enabling to generate plasma. For instance, the mixed gas of Ne(96%)—Xe(4%) is injected at 500 torr to generate plasma.

When the electroluminescent layers 102 are formed of the high molecular organic electroluminescent material by ink-jet or screen print, hole transport layers are further formed on the anode layers 98 so that the electroluminescent layers 102 are preferably placed on the hole transport layers.

When the electroluminescent layers 102 are formed of the low molecular organic electroluminescent material using fluorescence by vacuum evaporation, both hole injection layers and hole transport layers are further inserted between the anode layers 98 and the electroluminescent layers 102, and electron transport layers are further inserted between the electroluminescent layers 102 and the cathode layers 103.

And, When the electroluminescent layers 102 are formed of the low molecular organic electroluminescent material using phosphorescence by vacuum evaporation, both hole injection layers and hole transport layers are further inserted between the anode layers 98 and the electroluminescent layers 102, and both hole blocking layers and electron transport layers are further inserted between the electroluminescent layers 102 and the cathode layers 103.

As mentioned in the above description, the PSOELD according to the present invention enables to be driven by a driving voltage lower than that of the PDP according to the related art by using a plasma switch as a driving device playing a role as a switch only instead of a purpose for irradiating massive vacuum UV rays from the generation of plasma.

And, the present invention enables to fabricate a high efficient display free from a residual color effect by emitting light through an organic electroluminescence.

Moreover, compared to the display using TFT as a driving device, the present invention enables to be fabricated by a simple fabricating process.

Furthermore, the present invention enables to provide a large-sized display with ease.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A plasma switched electroluminescent display comprising:
   an electroluminescent part including a cathode layer, an electroluminescent layer on the cathode layer, and an anode layer on the electroluminescent layer;
   a first power supply unit connected electrically to the anode layer and disconnected electrically to the cathode layer so as to supply the electroluminescent layer with a first power;
   a plasma generating part generating a plasma wherein the plasma becomes contacted with the cathode layer; and
   a second power supply unit generating the plasma by supplying the plasma generating part with a second power,
   wherein the cathode layer is connected electrically to the first power supply unit through the plasma.

2. The plasma switched electroluminescent display of claim 1, further comprising an address electrode installed between the plasma generating part and the first power supply unit so as to connect the cathode layer electrically to the first power supply unit through the plasma.

3. The plasma switched electroluminescent display of claim 2, wherein the first power is applied to the cathode layer by the plasma via the address electrode.

4. The plasma switched electroluminescent display of claim 1, wherein the cathode layer is a floating electrode.

5. The plasma switched electroluminescent display of claim 1, wherein the electroluminescent layer is selected from the group consisting of high molecular organic electroluminescent material, low molecular electroluminescent material using fluorescence, and low molecular electroluminescent material using phosphorescence.

6. A plasma switched organic electroluminescent display comprising:
   a lower plate comprising:
      a first substrate;
      a plurality of sustain electrodes arranged on the first substrate in parallel with each other so as to construct a plurality of sustain electrode pairs wherein each of the sustain electrode pairs comprises a pair of the sustain electrodes adjacent to each other;
      a dielectric layer on the first substrate including the sustain electrodes; and
      a plurality of barrier ribs formed on the dielectric layer to define a plurality of pixel areas constructing a plurality of rows and columns so that each of the sustain electrode pairs is placed in the corresponding row or column; and
   an upper plate comprising:
      a second substrate;
      a plurality of address electrodes arranged on the second substrate so as to leave a predetermined interval each other wherein the address electrodes cross the sustain electrodes at right angles;
      a plurality of anode layers arranged on the second substrate so as to be placed next to the address electrodes in the pixel areas;
      a plurality of inner insulating/separating layers formed on the second substrate, each of the inner insulating/separating layers having an address electrode opening exposing the corresponding address electrode and an anode opening exposing the corresponding anode;
      a plurality of electroluminescent layers formed on the inner insulating/separating layers in the pixel areas, each of the electroluminescent layers contacted with the corresponding anode layer exposed through the anode opening; and
      a plurality of cathode layers formed on the electroluminescent layers.

7. The plasma switched organic electroluminescent display of claim 6, further comprising a protecting layer formed of MgO on the dielectric layer.

8. The plasma switched organic electroluminescent display of claim 6, wherein the anode layers are selected from the group consisting of ITO (indium tin oxide) and IZO (indium zinc oxide).

9. The plasma switched organic electroluminescent display of claim 6, wherein each of the anode openings extends to edges of a top of the corresponding anode layer so as to increase an aperture ratio of the display.

10. The plasma switched organic electroluminescent display of claim 6, wherein the electroluminescent layers are formed by a means selected from the group consisting of screen print, ink-jet print, dry film laminate, and vacuum evaporation using a shadow mask.

11. The plasma switched organic electroluminescent display of claim 6, further comprising:
- a plurality of hole injection layers and a plurality of hole transport layers stacked in order between the anode layers and the electroluminescent layers;
- a plurality of hole blocking layers formed on the electroluminescent layers; and
- a plurality of electron transport layers formed on the hole blocking layers.

12. A plasma switched organic electroluminescent display comprising:
- a lower plate comprising:
  - a first substrate;
  - a plurality of sustain electrodes arranged on the first substrate in parallel with each other so as to construct a plurality of sustain electrode pairs wherein each of the sustain electrode pairs comprises a pair of the sustain electrodes adjacent to each other;
  - a dielectric layer on the first substrate including the sustain electrodes;
  - a plurality of barrier ribs formed on the dielectric layer to define a plurality of pixel areas constructing a plurality of rows and columns so that each of the sustain electrode pairs is placed in the corresponding row or column;
  - a protecting layer covering the dielectric layer exposed between the barrier ribs; and
  - a plurality of exposed electrodes running in parallel with each other on portions of the protecting layer corresponding to middle parts of the sustain electrode pairs; and
- an upper plate comprising:
  - a second substrate;
  - a plurality of address electrodes arranged on the second substrate so as to leave a predetermined interval each other wherein the address electrodes cross the sustain electrodes at right angles;
  - a plurality of anode layers arranged on the second substrate so as to be placed next to the address electrodes in the pixel areas;
  - a plurality of inner insulating/separating layers formed on the second substrate, each of the inner insulating/separating layers having an anode opening exposing the corresponding anode layer;
  - a plurality of electroluminescent layers formed on the inner insulating/separating layers in the pixel areas, each of the electroluminescent layers contacted with the corresponding anode layer exposed through the anode opening; and
  - a plurality of cathode layers formed on the electroluminescent layers.

13. The plasma switched organic electroluminescent display of claim 12, wherein each of the anode openings extends to edges of a top of the corresponding anode layer so as to increase an aperture ratio of the display.

14. The plasma switched organic electroluminescent display of claim 12, wherein the electroluminescent layers are formed by a means selected from the group consisting of screen print, ink-jet print, dry film laminate, and vacuum evaporation using a shadow mask.

15. The plasma switched organic electroluminescent display of claim 12, further comprising:
- a plurality of hole injection layers and a plurality of hole transport layers stacked in order between the anode layers and the electroluminescent layers;
- a plurality of hole blocking layers formed on the electroluminescent layers; and
- a plurality of electron transport layers formed on the hole blocking layers.

16. A plasma switched organic electroluminescent display comprising:
- a lower plate comprising:
  - a first substrate;
  - a plurality of sustain electrodes arranged on the first substrate in parallel with each other so as to construct a plurality of sustain electrode pairs wherein each of the sustain electrode pairs comprises a pair of the sustain electrodes adjacent to each other;
  - a dielectric layer on the first substrate including the sustain electrodes; and
  - a plurality of barrier ribs formed on the dielectric layer to define a plurality of pixel areas constructing a plurality of rows and columns so that each of the sustain electrode pairs is placed in the corresponding row or column; and
- an upper plate comprising:
  - a second substrate;
  - a plurality of address electrodes arranged on the second substrate so as to leave a predetermined interval each other wherein the address electrodes cross the sustain electrodes at right angles;
  - a plurality of exposed electrodes in parallel with each other on the second substrate between the address electrodes;
  - a plurality of anode layers arranged on the second substrate so as to be placed between the address electrodes and the exposed electrodes in the pixel areas;
  - a plurality of inner insulating/separating layers formed on the second substrate including the address electrodes and the anode layers except the exposed electrodes, each of the inner insulating/separating layers having an anode opening exposing the corresponding anode layer;
  - a plurality of electroluminescent layers formed on the inner insulating/separating layers in the pixel areas, each of the electroluminescent layers contacted with the corresponding anode layer exposed through the anode opening; and
  - a plurality of cathode layers formed on the electroluminescent layers.

17. The plasma switched organic electroluminescent display of claim 16, wherein each of the anode openings extends to edges of a top of the corresponding anode layer so as to increase an aperture ratio of the display.

18. The plasma switched organic electroluminescent display of claim 16, wherein the electroluminescent layers are formed by a means selected from the group consisting of screen print, ink-jet print, dry film laminate, and vacuum evaporation using a shadow mask.

19. The plasma switched organic electroluminescent display of claim 16, further comprising a plurality of hole transport layers inserted between the anode layers and the electroluminescent layers.

20. The plasma switched organic electroluminescent display of claim 19, further comprising a plurality of hole injection layers inserted between the anode layers and the hole transport layers.

21. The plasma switched organic electroluminescent display of claim 16, further comprising a plurality of electron transport layers inserted between the electroluminescent layers and the cathode layers.

22. The plasma switched organic electroluminescent display of claim 21, further comprising a plurality of hole blocking layers inserted between the electroluminescent layers and the electron transport layers.

23. The plasma switched organic electroluminescent display of claim 16, further comprising a protecting layer formed of MgO on the dielectric layer.

* * * * *